United States Patent
Khlat (10) Patent No.: US 11,309,922 B2
(45) Date of Patent: Apr. 19, 2022

(54) MULTI-MODE POWER MANAGEMENT INTEGRATED CIRCUIT IN A SMALL FORMFACTOR WIRELESS APPARATUS

(71) Applicant: Qorvo US, Inc., Greensboro, NC (US)

(72) Inventor: Nadim Khlat, Cugnaux (FR)

(73) Assignee: QORVO US, INC., Greensboro, NC (US)

( * ) Notice: Subject to any disclaimer, the term of this patent is extended or adjusted under 35 U.S.C. 154(b) by 0 days.

(21) Appl. No.: 17/115,982

(22) Filed: Dec. 9, 2020

(65) Prior Publication Data

US 2021/0184708 A1   Jun. 17, 2021

Related U.S. Application Data (60) Provisional application No. 62/947,598, filed on Dec. 13, 2019.

(51) Int. Cl.
  *H04B 1/04* (2006.01)
  *H03F 1/02* (2006.01)
  (Continued)

(52) U.S. Cl.
  CPC .............. *H04B 1/04* (2013.01); *H03F 1/0233* (2013.01); *H03F 3/195* (2013.01);
  (Continued)

(58) Field of Classification Search
  None
  See application file for complete search history.

(56) References Cited

U.S. PATENT DOCUMENTS

| 5,510,753 A | 4/1996 | French |
| 5,838,732 A | 11/1998 | Carney |

(Continued)

FOREIGN PATENT DOCUMENTS

| EP | 3174199 A2 | 5/2012 |
| JP | H03104422 A | 5/1991 |

(Continued)

OTHER PUBLICATIONS

Notice of Allowance for U.S. Appl. No. 16/122,611, dated Apr. 1, 2021, 8 pages.

(Continued)

*Primary Examiner* — Pablo N Tran
(74) *Attorney, Agent, or Firm* — Withrow & Terranova, P.L.L.C.

(57) ABSTRACT

A multi-mode power management integrated circuit (PMIC) is provided. The PMIC includes a supply voltage circuit that generates a number of supply voltages based on an input voltage. The PMIC also includes a pair of voltage circuits each generating a respective voltage based on any of the supply voltages. In one operation mode, one of the voltage circuits is configured to generate an envelope tracking (ET) voltage and another one of the voltage circuits is configured to generate the input voltage for the supply voltage circuit. The input voltage may be generated according to a peak of the ET voltage to cause each of the supply voltages to be proportionally related to the peak of the ET voltage. Accordingly, the voltage circuit configured to generate the ET voltage can operate based on an appropriate one of the supply voltages, thus helping to improve efficiency and linearity of the voltage circuit.

20 Claims, 3 Drawing Sheets

(51) Int. Cl.
 *H03F 3/19* (2006.01)
 *H03F 3/45* (2006.01)
 *H03F 3/195* (2006.01)

(52) U.S. Cl.
 CPC .. *H03F 2200/105* (2013.01); *H03F 2200/451* (2013.01); *H04B 2001/045* (2013.01)

(56) References Cited

U.S. PATENT DOCUMENTS

| | | | |
|---|---|---|---|
| 6,107,862 A | 8/2000 | Mukainakano et al. | |
| 6,141,377 A | 10/2000 | Sharper et al. | |
| 6,141,541 A | 10/2000 | Midya et al. | |
| 6,411,531 B1 | 6/2002 | Nork et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 7,994,862 B1 | 8/2011 | Pukhovski | |
| 8,461,928 B2 | 6/2013 | Yahav et al. | |
| 8,493,141 B2 | 7/2013 | Khlat et al. | |
| 8,519,788 B2 | 8/2013 | Khlat | |
| 8,588,713 B2 | 11/2013 | Khlat | |
| 8,718,188 B2 | 5/2014 | Balteanu et al. | |
| 8,723,492 B2 | 5/2014 | Korzeniowski | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 | 10/2014 | Wilson | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,018,921 B2 | 4/2015 | Gurlahosur | |
| 9,020,451 B2 | 4/2015 | Khlat | |
| 9,041,364 B2 | 5/2015 | Khlat | |
| 9,041,365 B2 | 5/2015 | Kay et al. | |
| 9,055,529 B2 | 6/2015 | Shih | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 | 10/2015 | Hong et al. | |
| 9,166,830 B2 | 10/2015 | Camuffo et al. | |
| 9,167,514 B2 | 10/2015 | Dakshinamurthy et al. | |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,379,667 B2 | 6/2016 | Khlat et al. | |
| 9,445,371 B2 * | 9/2016 | Khesbak | H03F 3/45192 |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,923,520 B1 | 3/2018 | Abdelfattah et al. | |
| 10,003,416 B1 | 6/2018 | Lloyd | |
| 10,090,808 B1 | 10/2018 | Henzler et al. | |
| 10,097,145 B1 | 10/2018 | Khlat et al. | |
| 10,103,693 B2 * | 10/2018 | Zhu | H03F 3/195 |
| 10,110,169 B2 | 10/2018 | Khesbak et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,291,181 B2 | 5/2019 | Kim et al. | |
| 10,326,408 B2 | 6/2019 | Khlat et al. | |
| 10,382,071 B2 | 8/2019 | Rozek et al. | |
| 10,476,437 B2 | 11/2019 | Nag et al. | |
| 10,862,431 B1 | 12/2020 | Khlat | |
| 10,879,804 B2 * | 12/2020 | Kim | H03F 3/195 |
| 11,050,433 B1 | 6/2021 | Melanson et al. | |
| 11,121,684 B2 * | 9/2021 | Henzler | H03F 3/193 |
| 11,128,261 B2 | 9/2021 | Ranta et al. | |
| 2002/0167827 A1 | 11/2002 | Umeda et al. | |
| 2003/0107428 A1 | 6/2003 | Khouri et al. | |
| 2004/0266366 A1 | 12/2004 | Robinson et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0028271 A1 | 2/2006 | Wilson | |
| 2006/0240786 A1 | 10/2006 | Liu | |
| 2007/0052474 A1 | 3/2007 | Saito | |
| 2007/0258602 A1 | 11/2007 | Vepsalainen et al. | |
| 2008/0116960 A1 | 5/2008 | Nakamura | |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0283534 A1 | 11/2010 | Pierdomenico | |
| 2010/0308919 A1 | 12/2010 | Adamski et al. | |
| 2011/0074373 A1 | 3/2011 | Lin | |
| 2011/0136452 A1 | 6/2011 | Pratt et al. | |
| 2011/0175681 A1 | 7/2011 | Inamori et al. | |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 | 11/2012 | Southcombe et al. | |
| 2012/0299647 A1 | 11/2012 | Honjo et al. | |
| 2013/0021827 A1 | 1/2013 | Ye | |
| 2013/0100991 A1 | 4/2013 | Woo | |
| 2013/0127548 A1 | 5/2013 | Popplewell et al. | |
| 2013/0130724 A1 | 5/2013 | Kumar Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2013/0271221 A1 | 10/2013 | Levesque et al. | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0057684 A1 | 2/2014 | Khlat | |
| 2014/0103995 A1 | 4/2014 | Langer | |
| 2014/0155002 A1 | 6/2014 | Dakshinamurthy et al. | |
| 2014/0184335 A1 | 7/2014 | Nobbe et al. | |
| 2014/0199949 A1 | 7/2014 | Nagode et al. | |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2014/0361837 A1 | 12/2014 | Strange et al. | |
| 2015/0048883 A1 | 2/2015 | Vinayak | |
| 2015/0071382 A1 | 3/2015 | Wu et al. | |
| 2015/0098523 A1 | 4/2015 | Lim et al. | |
| 2015/0139358 A1 | 5/2015 | Asuri et al. | |
| 2015/0155836 A1 | 6/2015 | Midya et al. | |
| 2015/0188432 A1 | 7/2015 | Vannorsdel et al. | |
| 2015/0236652 A1 | 8/2015 | Yang et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0050629 A1 | 2/2016 | Khesbak et al. | |
| 2016/0065137 A1 | 3/2016 | Khlat | |
| 2016/0099686 A1 | 4/2016 | Perreault et al. | |
| 2016/0099687 A1 | 4/2016 | Khlat | |
| 2016/0105151 A1 | 4/2016 | Langer | |
| 2016/0118941 A1 | 4/2016 | Wang | |
| 2016/0126900 A1 | 5/2016 | Shute | |

(56) References Cited

U.S. PATENT DOCUMENTS

| | | |
|---|---|---|
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0321848 A1 | 10/2020 | Khlat |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0382066 A1 | 12/2020 | Khlat |
| 2021/0036604 A1 | 2/2021 | Khlat et al. |
| 2021/0159590 A1* | 5/2021 | Na .................. H01Q 1/40 |
| 2021/0194515 A1* | 6/2021 | Go .................. H04B 1/04 |

FOREIGN PATENT DOCUMENTS

| | | |
|---|---|---|
| WO | 2018182778 A1 | 10/2018 |
| WO | 2020206246 A1 | 10/2020 |
| WO | 2021046453 A1 | 3/2021 |

OTHER PUBLICATIONS

Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/582,471, dated Mar. 24, 2021, 11 pages.
Non-Final Office Action for U.S. Appl. No. 16/597,952, dated May 26, 2021, 7 pages.
Notice of Allowance for U.S. Appl. No. 16/582,471, dated Jun. 22, 2021, 9 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/834,049, dated Jun. 24, 2021, 8 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, mailed Mar. 6, 2020, 8 pages.

(56) References Cited

OTHER PUBLICATIONS

Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, mailed Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Patent Application No. 16/774,060, dated Aug. 17, 2020, 6 pages.
Notice of Allowance for U.S. Appl. No. 16/122,611, dated Dec. 1, 2020, 9 pages.
Quayle Action for U.S. Appl. No. 16/589,940, dated Dec. 4, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236, dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, dated Oct. 25, 2021, 6 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
International Search Report and Written Opinion for International Patent Application No. PCT/US2021/054141. dated Jan. 25, 2022, 15 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/052151, dated Jan. 4, 2022, 16 pages.

\* cited by examiner

MULTI-MODE POWER MANAGEMENT INTEGRATED CIRCUIT IN A SMALL FORMFACTOR WIRELESS APPARATUS

RELATED APPLICATIONS

This application claims the benefit of U.S. provisional patent application Ser. No. 62/947,598, filed on Dec. 13, 2019, the disclosure of which is incorporated herein by reference in its entirety.

FIELD OF THE DISCLOSURE

The technology of the disclosure relates generally to a multi-mode power management integrated circuit (PMIC) in a small formfactor wireless device, such as a wearable wireless device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in a mobile communication device, particularly when the mobile communication device is a small formfactor device such as a wearable wireless device.

Envelope tracking (ET) is a power management technology that can improve efficiency levels of the power amplifiers to help reduce power consumption and thermal dissipation. In this regard, it may be desirable to employ ET across the variety of wireless communication technologies in wearable wireless devices.

SUMMARY

Aspects disclosed in the detailed description include a multi-mode power management integrated circuit (PMIC). The PMIC includes a supply voltage circuit configured to generate a number of supply voltages based on an input voltage. The PMIC also includes a pair of voltage circuits each configured to generate a respective voltage (e.g., for a coupled amplifier circuit) based on any of the supply voltages. In one operation mode, one of the voltage circuits is configured to generate an envelope tracking (ET) voltage and another one of the voltage circuits is configured to generate the input voltage for the supply voltage circuit. In a non-limiting example, the input voltage is generated according to a peak of the ET voltage to cause each of the supply voltages to be proportionally related to the peak of the ET voltage as well. Accordingly, the voltage circuit configured to generate the ET voltage can operate based on an appropriate one of the supply voltages, thus helping to improve efficiency and linearity of the voltage circuit.

In one aspect, a multi-mode PMIC is provided. The multi-mode PMIC includes a supply voltage circuit configured to generate a plurality of supply voltages based on an input voltage. The multi-mode PMIC also includes a first voltage circuit configured to generate a first voltage at a first voltage output based on any one of the plurality of supply voltages. The multi-mode PMIC also includes a second voltage circuit configured to generate a second voltage at a second voltage output based on any one of the plurality of supply voltages. The multi-mode PMIC also includes a control circuit. In a first operation mode, the control circuit is configured to cause a first selected voltage circuit among the first voltage circuit and the second voltage circuit to generate an ET voltage among the first voltage and the second voltage. In the first operation mode, the control circuit is also configured to cause a second selected voltage circuit among the first voltage circuit and the second voltage circuit to generate a constant voltage among the first voltage and the second voltage. In the first operation mode, the control circuit is also configured to cause the supply voltage circuit to receive the constant voltage as the input voltage.

In another aspect, a wireless apparatus is provided. The wireless apparatus includes a multi-mode PMIC. The multi-mode PMIC includes a supply voltage circuit configured to generate a plurality of supply voltages based on an input voltage. The multi-mode PMIC also includes a first voltage circuit configured to generate a first voltage at a first voltage output based on any one of the plurality of supply voltages. The multi-mode PMIC also includes a second voltage circuit configured to generate a second voltage at a second voltage output based on any one of the plurality of supply voltages. The multi-mode PMIC also includes a control circuit. In a first operation mode, the control circuit is configured to cause a first selected voltage circuit among the first voltage circuit and the second voltage circuit to generate an ET voltage among the first voltage and the second voltage. In the first operation mode, the control circuit is also configured to cause a second selected voltage circuit among the first voltage circuit and the second voltage circuit to generate a constant voltage among the first voltage and the second voltage. In the first operation mode, the control circuit is also configured to cause the supply voltage circuit to receive the constant voltage as the input voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a multi-mode power management integrated circuit (PMIC). The PMIC includes a supply voltage circuit configured to generate a number of supply voltages based on an input voltage. The PMIC also includes a pair of voltage circuits each configured to generate a respective voltage (e.g., for a coupled amplifier circuit) based on any of the supply voltages. In one operation mode, one of the voltage circuits is configured to generate an envelope tracking (ET) voltage and another one of the voltage circuits is configured to generate the input voltage for the supply voltage circuit. In a non-limiting example, the input voltage is generated according to a peak of the ET voltage to cause each of the supply voltages to be proportionally related to the peak of the ET voltage as well. Accordingly, the voltage circuit configured to generate the ET voltage can operate based on an appropriate one of the supply voltages, thus helping to improve efficiency and linearity of the voltage circuit.

Figure 1:
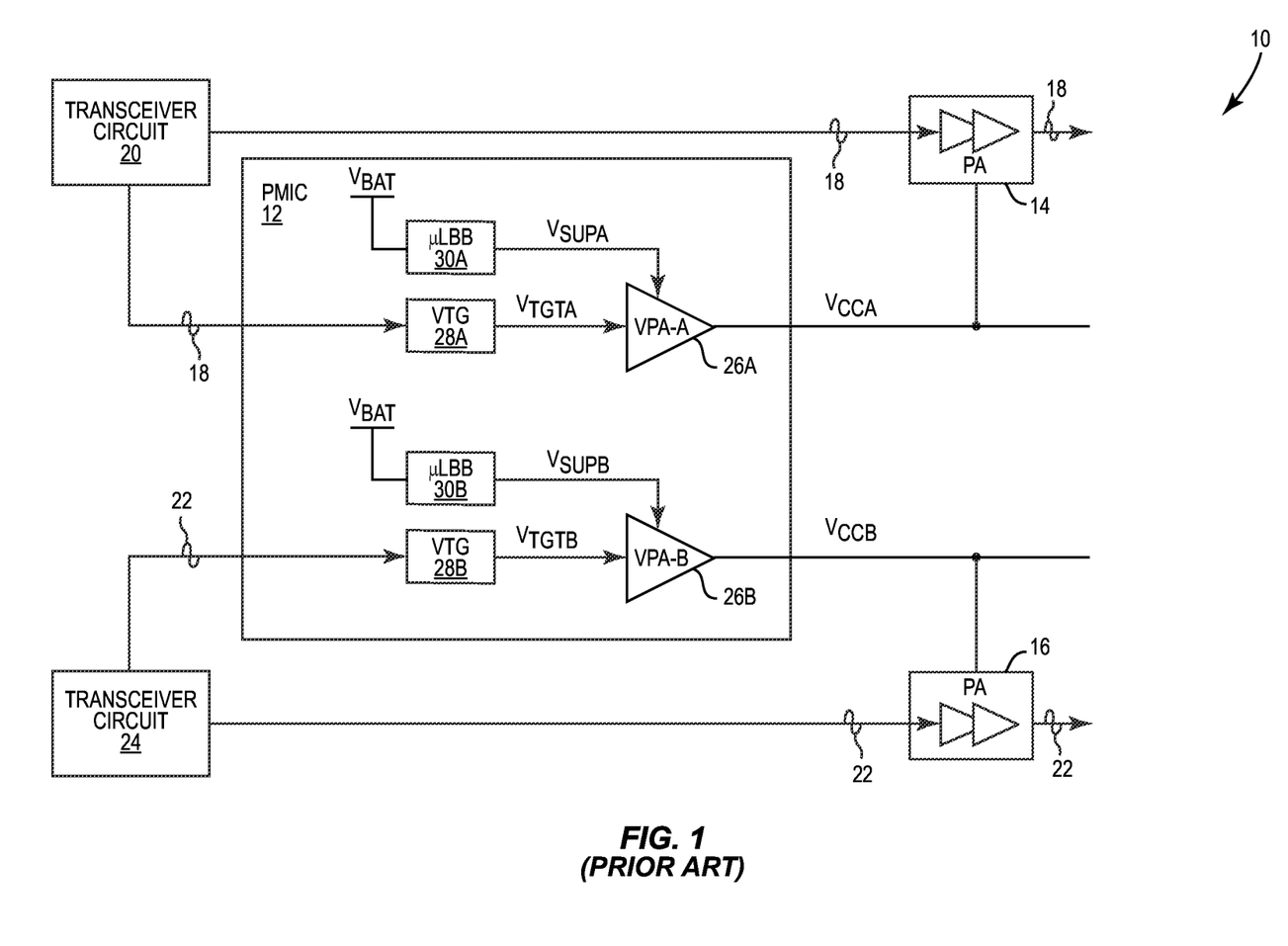
FIG. 1 is a schematic diagram of an exemplary conventional power management apparatus that may not be suitable for a small formfactor wireless device.
Figure 2:
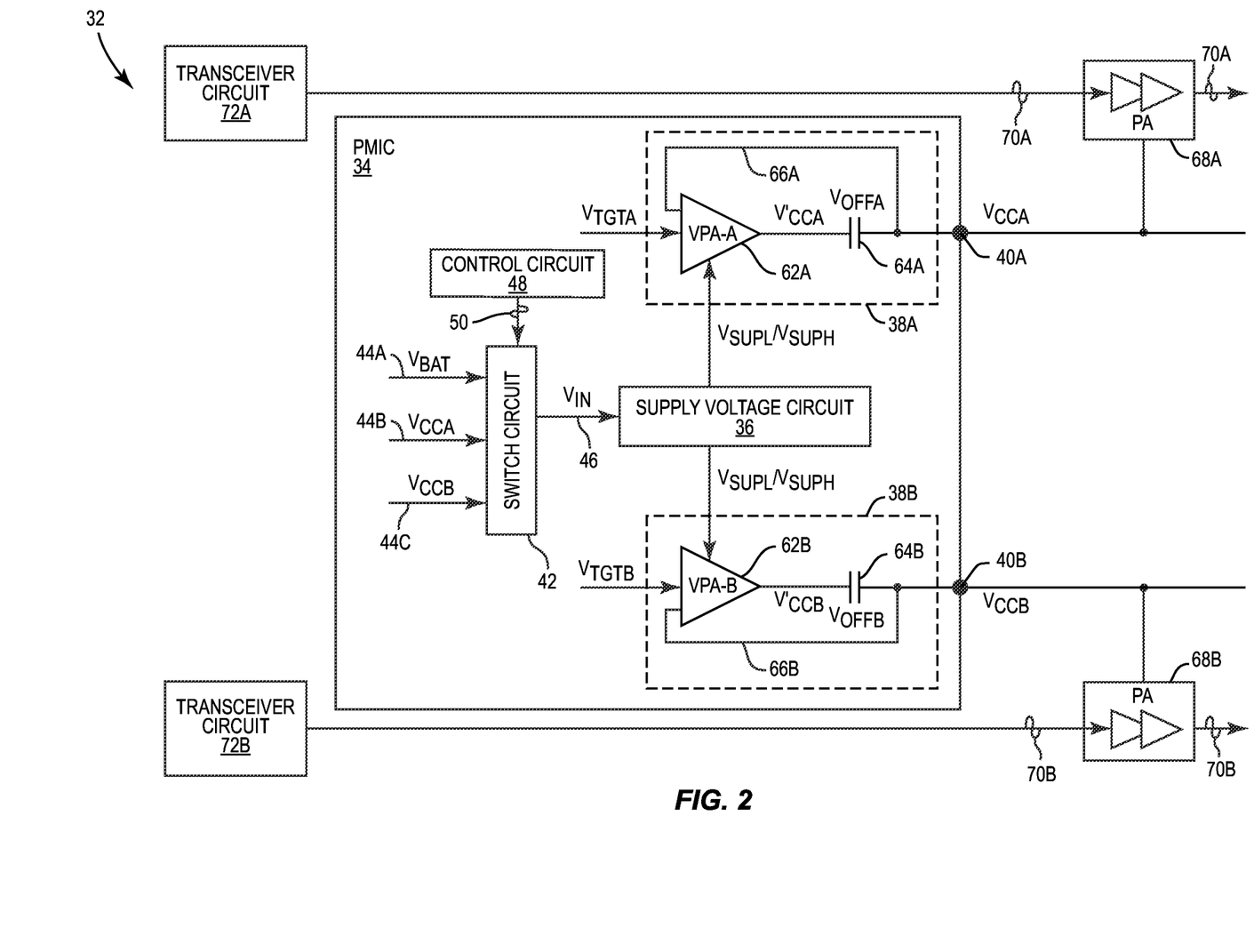
FIG. 2 is a schematic diagram of an exemplary wireless apparatus including a multi-mode power management integrated circuit (PMIC) and is suitable for a small formfactor wireless device.

Before discussing the multi-mode PMIC according to the present disclosure, starting at FIG. 2, an overview of a conventional power management apparatus is first provided with reference to FIG. 1.

FIG. 1 is a schematic diagram of an exemplary conventional power management apparatus 10 that may not be suitable for a small formfactor wireless device. The conventional power management apparatus 10 includes a conventional PMIC 12 configured to provide a first ET voltage $V_{CCA}$ and a second ET voltage $V_{CCB}$ to a first amplifier circuit 14 and a second amplifier circuit 16, respectively. The first amplifier circuit 14 is configured to receive a first radio frequency (RF) signal 18 from a first transceiver circuit 20 and amplify the first RF signal 18 based on the first ET voltage $V_{CCA}$. The second amplifier circuit 16 is configured to receive a second RF signal 22 from a second transceiver circuit 24 and amplify the second RF signal 22 based on the second ET voltage $V_{CCB}$.

The conventional PMIC 12 includes a first voltage amplifier 26A (denoted as "VPA-A") configured to receive a first ET target voltage $V_{TGTA}$, which tracks (rises and falls) time-variant power levels of the first RF signal 18, and a first supply voltage $V_{SUPA}$. Accordingly, the first voltage amplifier 26A generates the first ET voltage $V_{CCA}$, which tracks (rises and falls) the first ET target voltage $V_{TGTA}$, based on the first supply voltage $V_{SUPA}$. The conventional PMIC 12 also includes a first target voltage circuit 28A (denoted as "VTG") and a first supply voltage circuit 30A (denoted as "µLBB"). The first target voltage circuit 28A is configured to generate the first ET target voltage $V_{TGTA}$ to track the time-variant power variation of the first RF signal 18. The first supply voltage circuit 30A is configured to generate the first supply voltage $V_{SUPA}$ at multiple different levels based on a battery voltage $V_{BAT}$. For example, the first supply voltage circuit 30A can generate the first supply voltage $V_{SUPA}$ that equals $V_{BAT}$ or two-times $V_{BAT}$.

The conventional PMIC 12 includes a second voltage amplifier 26B (denoted as "VPA-B") configured to receive a second ET target voltage $V_{TGTB}$, which tracks (rises and falls) time-variant power levels of the second RF signal 22, and a second supply voltage $V_{SUPB}$. Accordingly, the second voltage amplifier 26B generates the second ET voltage $V_{CCB}$, which tracks (rises and falls) the second ET target voltage $V_{TGTB}$, based on the second supply voltage $V_{SUPB}$. The conventional PMIC 12 also includes a second target voltage circuit 28B (denoted as "VTG") and a second supply voltage circuit 30B (denoted as "µLBB"). The second target voltage circuit 28B is configured to generate the second ET target voltage $V_{TGTB}$ to track the time-variant power variation of the second RF signal 22. The second supply voltage circuit 30B is configured to generate the second supply voltage $V_{SUPB}$ at multiple different levels based on the battery voltage $V_{BAT}$. For example, the second supply voltage circuit 30B can generate the second supply voltage $V_{SUPB}$ that equals $V_{BAT}$ or two-times $V_{BAT}$.

The first RF signal 18, which can be a long-term evolution (LTE) signal as an example, may be different from the second RF signal 22, which can be a Wi-Fi signal as an example. In this regard, the first RF signal 18 and the second RF signal 22 may correspond to different time-variant power levels. As such, to achieve maximum operating efficiency and linearity in the first voltage amplifier 26A and the second voltage amplifier 26B, the first supply voltage circuit 30A and the second supply voltage circuit 30B are both needed in the conventional PMIC 12 to help customize the first supply voltage $V_{SUPA}$ and the second supply voltage $V_{SUPB}$. As a result, the conventional PMIC 12 may require a larger footprint, thus making it difficult to fit the conventional PMIC 12 into a wearable device, such as smartwatch, smart glass, ear pot, and so on.

In addition, the battery voltage $V_{BAT}$ can droop over time due to power consumption by the first supply voltage circuit 30A and the second supply voltage circuit 30B. Although it may be possible to add a low-dropout (LDO) to maintain the battery voltage $V_{BAT}$ at a desired level, doing so may further increase the footprint of the conventional PMIC 12. As such, it is desired to reduce the footprint of the conventional PMIC 12 for such small formfactor wireless devices as wearable wireless devices.

In this regard, FIG. 2 is a schematic diagram of an exemplary wireless apparatus 32 including a multi-mode PMIC 34 and is suitable for a small formfactor wireless device, such as a wearable wireless device. In contrast to the conventional PMIC 12 in FIG. 1, the multi-mode PMIC 34 includes only one supply voltage circuit 36. As such, the multi-mode PMIC 34 can take a smaller footprint compared to the conventional PMIC 12, thus making it possible to fit the multi-mode PMIC 34 and the wireless apparatus as a whole into such small formfactor wireless devices like wearable wireless devices.

The supply voltage circuit 36 is configured to generate a number of supply voltages $V_{SUPL}$, $V_{SUPH}$ ($V_{SUPH}$>$V_{SUPL}$) based on an input voltage $V_{IN}$. In a non-limiting example, the lower supply voltage $V_{SUPL}$ equals the input voltage $V_{IN}$ ($V_{SUPL}$=$V_{IN}$) and the higher supply voltage $V_{SUPH}$ equals two times the input voltage $V_{IN}$ ($V_{SUPH}$=$2\times V_{IN}$). It should be appreciated that the supply voltage circuit 36 can be configured to generate the supply voltages at additional levels.

The multi-mode PMIC 34 includes a first voltage circuit 38A coupled to a first voltage output 40A and a second voltage circuit 38B coupled to a second voltage output 40B. The first voltage circuit 38A is configured to generate a first voltage $V_{CCA}$ at the first voltage output 40A based on any one of the supply voltages $V_{SUPL}$, $V_{SUPH}$. In examples discussed herein, the first voltage circuit 38A can generate the first voltage $V_{CCA}$ as either an ET voltage or a constant voltage. When generating the ET voltage, the first voltage circuit 38A can be configured to generate the ET voltage to track a first ET target voltage $V_{TGTA}$ and based on a lower one of the supply voltages $V_{SUPL}$, $V_{SUPH}$ that is higher than or equal to the first ET target voltage $V_{TGTA}$.

The second voltage circuit 38B is configured to generate a second voltage $V_{CCB}$ at the second voltage output 40B based on any one of the supply voltages $V_{SUPL}$, $V_{SUPH}$. In examples discussed herein, the second voltage circuit 38B can generate the second voltage $V_{CCB}$ as either an ET voltage or a constant voltage. When generating the ET voltage, the second voltage circuit 38B can be configured to generate the ET voltage to track a second ET target voltage $V_{TGTB}$ and based on a lower one of the supply voltages $V_{SUPL}$, $V_{SUPH}$ that is higher than or equal to the second ET target voltage $V_{TGTB}$.

The multi-mode PMIC 34 includes a switch circuit 42. In a non-limiting example, the switch circuit 42 includes a first switch input 44A, a second switch input 44B, a third switch input 44C, and a switch output 46. The first switch input 44A may be coupled to a battery to receive a battery voltage $V_{BAT}$, the second switch input 44B may be coupled to the first voltage output 40A to receive the first voltage $V_{CCA}$, and the third switch input 44C may be coupled to the second voltage output 40B to receive the second voltage $V_{CCB}$. The switch output 46 may be coupled to the supply voltage circuit 36 to provide one of the battery voltage $V_{BAT}$, the first voltage $V_{CCA}$, and the second voltage $V_{CCB}$ to the supply voltage circuit 36 as the input voltage $V_{IN}$.

The multi-mode PMIC 34 can further include a control circuit 48, which can be a microcontroller or a field-programmable gate array (FPGA), as an example. In examples described below, the multi-mode PMIC 34 can be configured to a first operation mode or a second operation mode. In the first operation mode, only one of the first voltage circuit 38A and the second voltage circuit 38B (a.k.a., "a first selected voltage circuit") will generate an ET voltage among the first voltage $V_{CCA}$ and the second voltage $V_{CCB}$. In this regard, the control circuit 48 can cause another one of the first voltage circuit 38A and the second voltage circuit 38B (a.k.a. "a second selected voltage circuit") to generate a constant voltage among the first voltage $V_{CCA}$ and the second voltage $V_{CCB}$. Accordingly, one of the second switch input 44B and the third switch input 44C will receive the constant voltage. As such, the control circuit 48 can control the switch circuit 42 to couple the one of the second switch input 44B and the third switch input 44C to the switch output 46 such that the constant voltage is provided to the supply voltage circuit 36 as the input voltage $V_{IN}$.

In the second operation mode, the first voltage circuit 38A and the second voltage circuit 38B are configured to generate the first voltage $V_{CCA}$ and the second voltage $V_{CCB}$, respectively, as ET voltages. In this regard, the control circuit 48 can control the switch circuit 42 to couple the first switch input 44A to the switch output 46 such that the battery voltage $V_{BAT}$ is provided to the supply voltage circuit 36 as the input voltage $V_{IN}$. In a non-limiting example, the control circuit 48 can couple any of the first switch input 44A, the second switch input 44B, and the third switch input 44C to the switch output 46 based on a control signal 50.

Figure 3:
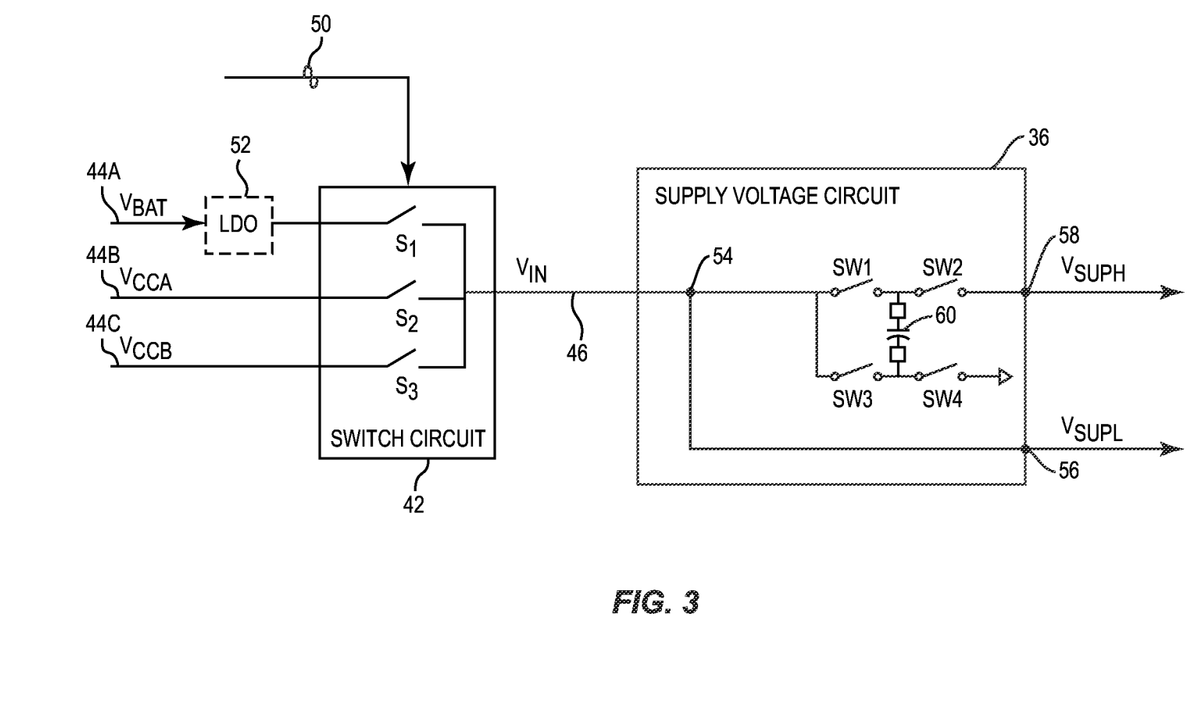
FIG. 3 is schematic diagram providing an exemplary illustration of a supply voltage circuit in the multi-mode PMIC of FIG. 2 configured according to one embodiment of the present disclosure.

FIG. 3 is a schematic diagram providing an exemplary illustration of the supply voltage circuit 36 in the multi-mode PMIC 34 of FIG. 2 configured according to one embodiment of the present disclosure. Common elements between FIGS. 2 and 3 are shown therein with common element numbers and will not be re-described herein.

In a non-limiting example, the switch circuit 42 includes a first switch $S_1$ coupled between the first switch input 44A and the switch output 46, a second switch $S_2$ coupled between the second switch input 44B and the switch output 46, as well as a third switch $S_3$ coupled between the third switch input 44C and the switch output 46. The first switch $S_1$, the second switch $S_2$, and the third switch $S_3$ can be any type of switches. The control circuit 48 can selectively control (open or close) any of the first switch $S_1$, the second switch $S_2$, and the third switch $S_3$ based on the control signal 50. Notably, it is also possible to optionally provide an LDO circuit 52 between the first switch input 44A and the first switch $S_1$ to help maintain the battery voltage $V_{BAT}$ at a desired level.

The supply voltage circuit 36 includes an input node 54 coupled to the switch output 46 to receive the input voltage $V_{IN}$. The supply voltage circuit 36 includes a first output node 56 and a second output node 58 configured to output the lower supply voltage $V_{SUPL}$ and the higher supply voltage $V_{SUPH}$, respectively. The supply voltage circuit 36 includes switches SW1, SW2, SW3, and SW4, which can be any type of switches. The switches SW1 and SW2 are coupled in series between the input node 54 and the second output node 58. The switches SW3 and SW4 are coupled in series between the input node 54 and the first output node 56. The supply voltage circuit 36 includes a fly capacitor 60 having one end coupled in between the switch SW1 and the switch SW2, and another end coupled in between the switch SW3 and the switch SW4.

In a non-limiting example, the supply voltage circuit 36 can be controlled to generate the lower supply voltage $V_{SUPL}$ at the input voltage $V_{IN}$ ($V_{SUPL}=V_{IN}$) and the higher supply voltage $V_{SUPH}$ at two times the input voltage $V_{IN}$ ($V_{SUPH}=2 \times V_{SUP}$). To generate the higher supply voltage $V_{SUPH}$ at $2 \times V_{IN}$, the switches SW2 and SW4 are closed, while the switches SW2 and SW3 remain open. As such, the fly capacitor 60 can be charged up to the input voltage $V_{IN}$. Subsequently, the switches SW2 and SW4 are opened, while the switches SW2 and SW3 are closed. Accordingly, the higher supply voltage $V_{SUPH}$ can be outputted at $2*V_{IN}$.

With reference back to FIG. 2, the first voltage circuit 38A includes a first voltage amplifier 62A (denoted as "VPA-A") and a first offset capacitor 64A. The first voltage amplifier 62A is configured to generate a first initial voltage $V'_{CCA}$ based on any one of the supply voltages $V_{SUPL}$, $V_{SUPH}$. The first offset capacitor 64A is coupled between the first voltage amplifier 62A and the first voltage output 40A. The first offset capacitor 64A is configured to raise the first initial voltage $V'_{CCA}$ by a first offset voltage $V_{OFFA}$ (e.g., 0.8 V) to generate the first voltage $V_{CCA}$ at the first voltage output 40A ($V_{CCA}=V'_{CCA}+V_{OFFA}$). The first voltage circuit 38A can be a closed-loop voltage circuit and include a first feedback loop 66A.

The second voltage circuit 38B includes a second voltage amplifier 62B (denoted as "VPA-B") and a second offset capacitor 64B. The second voltage amplifier 62B is configured to generate a second initial voltage $V'_{CCB}$ based on any one of the supply voltages $V_{SUPL}$, $V_{SUPH}$. The second offset capacitor 64B is coupled between the second voltage amplifier 62B and the second voltage output 40B. The second offset capacitor 64B is configured to raise the second initial voltage $V'_{CCB}$ by a second offset voltage $V_{OFFB}$ (e.g., 0.8 V) to generate the second voltage $V_{CCB}$ at the second voltage output 40B ($V_{CCB}=V'_{CCB}+V_{OFFB}$). The second voltage circuit 38B can be a closed-loop voltage circuit and include a second feedback loop 66B.

The wireless apparatus 32 includes a first amplifier circuit 68A coupled to the first voltage output 40A and configured to amplify a first RF signal 70A based on the first voltage $V_{CCA}$. In a non-limiting example, the first RF signal 70A is originated from a first transceiver 72A (e.g., an LTE transceiver). The wireless apparatus 32 also includes a second amplifier circuit 68B coupled to the second voltage output 40B and configured to amplify a second RF signal 70B based on the second voltage $V_{CCB}$. In a non-limiting example, the second RF signal 70B is originated from a second transceiver 72B (e.g., a Wi-Fi transceiver).

In the first operation mode, only one of the first RF signal 70A and the second RF signal 70B needs to be transmitted. Accordingly, only one of the first amplifier circuit 68A and the second amplifier circuit 68B will be activated. As a result, the multi-mode PMIC 34 only needs to generate one of the first voltage $V_{CCA}$ and the second voltage $V_{CCB}$ as the ET voltage.

In one example, the control circuit 48 determines that the first RF signal 70A is present and the second RF signal 70B is absent. As such, the control circuit 48 can cause the first voltage circuit 38A to generate the first voltage $V_{CCA}$ as the ET voltage and cause the second voltage circuit 38B to generate the second voltage $V_{CCB}$ as the constant voltage. In a non-limiting example, the second voltage circuit 38B can be configured to generate the constant voltage to be equal to a peak of the ET voltage minus the first offset voltage $V_{OFFA}$ and plus a headroom voltage of the first voltage amplifier 62A. The control circuit 48 is further configured to open the first switch $S_1$, the second switch $S_2$, and close the third switch $S_3$ in the switch circuit 42 to couple the third switch input 44C to the switch output 46 to provide the constant voltage to the supply voltage circuit 36 as the input voltage $V_{IN}$.

In another example, the control circuit 48 determines that the first RF signal 70A is absent and the second RF signal 70B is present. As such, the control circuit 48 can cause the second voltage circuit 38B to generate the second voltage $V_{CCB}$ as the ET voltage and cause the first voltage circuit 38A to generate the first voltage $V_{CCA}$ as the constant voltage. In a non-limiting example, the first voltage circuit 38A can be configured to generate the constant voltage to be equal to a peak of the ET voltage minus the second offset voltage $V_{OFFB}$ and plus a headroom voltage of the second voltage amplifier 62B. The control circuit 48 is further configured to open the first switch $S_1$, the third switch $S_3$, and close the second switch $S_2$ in the switch circuit 42 to couple the second switch input 44B to the switch output 46 to provide the constant voltage to the supply voltage circuit 36 as the input voltage $V_{IN}$.

In contrast, in the second operation mode, both the first RF signal 70A and the second RF signal 70B need to be transmitted. Accordingly, both the first amplifier circuit 68A and the second amplifier circuit 68B will be activated. As a result, the multi-mode PMIC 34 needs to generate the first voltage $V_{CCA}$ and the second voltage $V_{CCB}$ both as ET voltages.

In this regard, the control circuit 48 determines that the first RF signal 70A and the second RF signal 70B are both present. Accordingly, the control circuit 48 will cause the first voltage circuit 38A to generate a first ET voltage $V_{CCA}$ at the first voltage output 40A and cause the second voltage circuit 38B to generate a second ET voltage $V_{CCB}$ at the second voltage output 40B. The control circuit 48 is further configured to open the second switch $S_2$, the third switch $S_3$, and close the first switch $S_1$ to couple the first switch input 44A to the switch output 46 to provide the battery voltage $V_{BAT}$ to the supply voltage circuit 36 as the input voltage $V_{IN}$.

Those skilled in the art will recognize improvements and modifications to the embodiments of the present disclosure. All such improvements and modifications are considered within the scope of the concepts disclosed herein and the claims that follow.

What is claimed is:

1. A multi-mode power management integrated circuit (PMIC) comprising:
   a supply voltage circuit configured to generate a plurality of supply voltages based on an input voltage;
   a first voltage circuit configured to generate a first voltage at a first voltage output based on any one of the plurality of supply voltages;
   a second voltage circuit configured to generate a second voltage at a second voltage output based on any one of the plurality of supply voltages; and
   a control circuit configured to, in a first operation mode:
      cause a first selected voltage circuit among the first voltage circuit and the second voltage circuit to generate an envelope tracking (ET) voltage among the first voltage and the second voltage;
      cause a second selected voltage circuit among the first voltage circuit and the second voltage circuit to generate a constant voltage among the first voltage and the second voltage; and
      cause the supply voltage circuit to receive the constant voltage as the input voltage.

2. The multi-mode PMIC of claim 1 wherein:
   the first voltage circuit comprises:
      a first voltage amplifier configured to generate a first initial voltage based on the any one of the plurality of supply voltages; and
      a first offset capacitor configured to raise the first initial voltage by a first offset voltage to generate the first voltage at the first voltage output; and
   the second voltage circuit comprises:
      a second voltage amplifier configured to generate a second initial voltage based on the any one of the plurality of supply voltages; and
      a second offset capacitor configured to raise the second initial voltage by a second offset voltage to generate the second voltage at the second voltage output.

3. The multi-mode PMIC of claim 2 further comprising a switch circuit, the switch circuit comprising:
   a first switch input coupled to a battery to receive a battery voltage;
   a second switch input coupled to the first voltage output to receive the first voltage;
   a third switch input coupled to the second voltage output to receive the second voltage; and
   a switch output coupled to the first switch input, the second switch input, and the third switch input via a first switch, a second switch, and a third switch, respectively;
   wherein the control circuit is further configured to control the first switch, the second switch, and the third switch to cause the switch output to output any one of the battery voltage, the first voltage, and the second voltage as the input voltage.

4. The multi-mode PMIC of claim 3 further comprising a low dropout (LDO) circuit coupled between the battery and the first switch input.

5. The multi-mode PMIC of claim 3 wherein the control circuit is further configured to:
   cause the first voltage circuit to generate the first voltage as the ET voltage; and
   cause the second voltage circuit to generate the constant voltage as the second voltage, wherein the constant voltage is equal to a peak of the ET voltage minus the first offset voltage and plus a headroom voltage of the first voltage amplifier.

6. The multi-mode PMIC of claim 5 wherein the control circuit is further configured to open the first switch and the second switch and close the third switch to couple the third switch input to the switch output to provide the constant voltage to the supply voltage circuit.

7. The multi-mode PMIC of claim 3 wherein the control circuit is further configured to:
   cause the second voltage circuit to generate the second voltage as the ET voltage; and
   cause the first voltage circuit to generate the constant voltage as the first voltage, wherein the constant voltage is equal to a peak of the ET voltage minus the second offset voltage and plus a headroom voltage of the second voltage amplifier.

8. The multi-mode PMIC of claim 7 wherein the control circuit is further configured to open the first switch and the third switch and close the second switch to couple the second switch input to the switch output to provide the constant voltage to the supply voltage circuit.

9. The multi-mode PMIC of claim 3 wherein the control circuit is further configured to, in a second operation mode:
   cause the first voltage circuit to generate a first ET voltage at the first voltage output;
   cause the second voltage circuit to generate a second ET voltage at the second voltage output; and
   cause the supply voltage circuit to receive the battery voltage as the input voltage.

10. The multi-mode PMIC of claim 9 wherein the control circuit is further configured to open the second switch and the third switch and close the first switch to couple the first switch input to the switch output to provide the battery voltage to the supply voltage circuit.

11. A wireless apparatus comprising:
    a multi-mode power management integrated circuit (PMIC) comprising:
       a supply voltage circuit configured to generate a plurality of supply voltages based on an input voltage;
       a first voltage circuit configured to generate a first voltage at a first voltage output based on any one of the plurality of supply voltages;
       a second voltage circuit configured to generate a second voltage at a second voltage output based on any one of the plurality of supply voltages; and
       a control circuit configured to, in a first operation mode:
          cause a first selected voltage circuit among the first voltage circuit and the second voltage circuit to generate an envelope tracking (ET) voltage among the first voltage and the second voltage;
          cause a second selected voltage circuit among the first voltage circuit and the second voltage circuit to generate a constant voltage among the first voltage and the second voltage; and
          cause the supply voltage circuit to receive the constant voltage as the input voltage.

12. The wireless apparatus of claim 11 further comprising:
    a first amplifier circuit coupled to the first voltage output and configured to amplify a first radio frequency (RF) signal based on the first voltage; and
    a second amplifier circuit coupled to the second voltage output and configured to amplify a second RF signal different from the first RF signal based on the second voltage.

13. The wireless apparatus of claim 12 wherein:
    the first voltage circuit comprises:
       a first voltage amplifier configured to generate a first initial voltage based on the any one of the plurality of supply voltages; and a first offset capacitor configured to raise the first initial voltage by a first offset voltage to generate the first voltage at the first voltage output; and the second voltage circuit comprises:
a second voltage amplifier configured to generate a second initial voltage based on the any one of the plurality of supply voltages; and
a second offset capacitor configured to raise the second initial voltage by a second offset voltage to generate the second voltage at the second voltage output.

14. The wireless apparatus of claim 13 wherein the multi-mode PMIC further comprises a switch circuit, the switch circuit comprising:
a first switch input coupled to a battery to receive a battery voltage;
a second switch input coupled to the first voltage output to receive the first voltage;
a third switch input coupled to the second voltage output to receive the second voltage; and
a switch output coupled to the first switch input, the second switch input, and the third switch input via a first switch, a second switch, and a third switch, respectively;
wherein the control circuit is further configured to control the first switch, the second switch, and the third switch to cause the switch output to output any one of the battery voltage, the first voltage, and the second voltage as the input voltage.

15. The wireless apparatus of claim 14 wherein the control circuit is further configured to:
determine that the first RF signal is present and the second RF signal is absent;
cause the first voltage circuit to generate the first voltage as the ET voltage; and
cause the second voltage circuit to generate the constant voltage as the second voltage, wherein the constant voltage is equal to a peak of the ET voltage minus the first offset voltage and plus a headroom voltage of the first voltage amplifier.

16. The wireless apparatus of claim 15 wherein the control circuit is further configured to open the first switch and the second switch and close the third switch to couple the third switch input to the switch output to provide the constant voltage to the supply voltage circuit.

17. The wireless apparatus of claim 14 wherein the control circuit is further configured to:
determine that the first RF signal is absent and the second RF signal is present;
cause the second voltage circuit to generate the second voltage as the ET voltage; and
cause the first voltage circuit to generate the constant voltage as the first voltage, wherein the constant voltage is equal to a peak of the ET voltage minus the second offset voltage and plus a headroom voltage of the second voltage amplifier.

18. The wireless apparatus of claim 17 wherein the control circuit is further configured to open the first switch and the third switch and close the second switch to couple the second switch input to the switch output to provide the constant voltage to the supply voltage circuit.

19. The wireless apparatus of claim 14 wherein the control circuit is further configured to, in a second operation mode:
determine that the first RF signal and the second RF signal are both present;
cause the first voltage circuit to generate a first ET voltage at the first voltage output;
cause the second voltage circuit to generate a second ET voltage at the second voltage output; and
cause the supply voltage circuit to receive the battery voltage as the input voltage.

20. The wireless apparatus of claim 19 wherein the control circuit is further configured to open the second switch and the third switch and close the first switch to couple the first switch input to the switch output to provide the battery voltage to the supply voltage circuit.

* * * * *